United States Patent [19]
Staver

[11] Patent Number: 5,436,858
[45] Date of Patent: Jul. 25, 1995

[54] DECIMATION CIRCUIT AND METHOD FOR FILTERING QUANTIZED SIGNALS WHILE PROVIDING PHASE ANGLE CORRECTION WITH A SUBSTANTIALLY LINEAR PHASE RESPONSE

[75] Inventor: Daniel A. Staver, Scotia, N.Y.

[73] Assignee: General Electric Company, Schenectady, N.Y.

[21] Appl. No.: 223,195

[22] Filed: Apr. 5, 1994

[51] Int. Cl.$^6$ ............................................. G06F 15/31
[52] U.S. Cl. ................................................ 364/724.1
[58] Field of Search ..................... 364/724.1; 341/143; 375/96

[56] References Cited

U.S. PATENT DOCUMENTS

| | | | |
|---|---|---|---|
| 4,783,660 | 11/1988 | Pierce | 364/724.12 |
| 4,833,474 | 5/1989 | Nagai et al. | 364/724.1 |
| 4,896,156 | 1/1990 | Garverick | 341/143 |
| 4,951,052 | 8/1990 | Jacob et al. | 341/122 |
| 5,126,961 | 6/1992 | Garverick | 364/724.10 |
| 5,134,578 | 7/1992 | Garverick et al. | 364/752 |
| 5,181,033 | 1/1993 | Yassa et al. | 341/143 |
| 5,329,553 | 7/1994 | Abbiate et al. | 364/724.1 |
| 5,331,583 | 7/1994 | Hara et al. | 364/724.1 |

OTHER PUBLICATIONS

"A programmable Mixed–Signal ASIC for Power Meeting", S. L. Garverick, K. Fujjino, D. T. McGrath, R. D. Baertsch, IEEE Journal of Solid–State Circuits, vol. 26, No. 12, Dec. 1991, pp. 2008–2016.

"A Programmable Mixed Signal SIC For Power Management," D. McGrath, P. Jacob, H. Sailer, IEEE 1991 Custom Integrated Circuits Conf., 1992, pp. 19.4.1–19.4.3.

"Handbook of Digital Signal Processing", Engineering Applications, Edited by D. F. Elliott, 1987, pp. 453–456.

*Primary Examiner*—Tan V. Mai
*Attorney, Agent, or Firm*—Enrique J. Mora; Marvin Snyder

[57] ABSTRACT

A decimation circuit for filtering a stream of quantized electrical signals while providing phase angle correction and a substantially linear phase response over a predetermined passband range $F_B$ is provided. The stream of quantized electrical signals arrives at a predetermined rate $F_M$ from an oversampling delta-sigma modulator. The decimation circuit includes a decimation filter for filtering the stream of quantized electrical signals to provide a filtered output signal at an output ram $F'_S$ defined by $F'_S = F_M/R$ wherein R is a positive integer. A phase corrector is coupled to the decimation filter to receive the filtered output signal and to correct the phase angle of the received filtered signal so as to provide an equalized phase angle at least over the predetermined range $F_B$. The value for R is selected such that output rate $F'_S$ is sufficiently situated above bandpass range $F_B$ such that the phase corrector provides a desired substantially linear phase response over the passband range $F_B$.

13 Claims, 5 Drawing Sheets

DECIMATION CIRCUIT AND METHOD FOR FILTERING QUANTIZED SIGNALS WHILE PROVIDING PHASE ANGLE CORRECTION WITH A SUBSTANTIALLY LINEAR PHASE RESPONSE

RELATED APPLICATIONS

This application is related to allowed U.S. patent application Ser. No. 08/223,196, (RD-23017) entitled "Decimation Circuit and Method for Filtering Quantized Signals While Providing a Substantially Uniform Magnitude and a Substantially Linear Phase Response," by D. A. Staver, filed concurrently with the present application, assigned to the assignee of the present invention and herein incorporated by reference.

BACKGROUND OF THE INVENTION

The present invention is generally related to decimation circuits used, for example, in oversampled delta-sigma analog-to-digital converters, and, in particular, to a decimation circuit and method for filtering quantized electrical signals while providing phase angle correction with a substantially linear phase response at least over a desired passband range.

Data acquisition systems for generating digital data for the purposes of computation may receive analog input signals from a plurality of sensors, such as voltage and current sensors, each having a respective phase angle characteristic. The respective analog signals from the plurality of sensors must be digitized or quantized before they can be used by a computer as a basis for supporting computations. It is desirable to include respective analog-to-digital converters within the confines of an inexpensive single monolithic integrated circuit. Such data acquisition circuit can be constructed using metal-oxide-semiconductor (MOS) integrated circuit technology and is suited for applications such as power metering, electric motor and internal-combustion engine control.

Oversampling analog-to-digital converters of delta-sigma type are particularly economical of digital hardware. The use of such converter introduces the need for decimation filters such as $sinc^k$ decimation filters, in which the kernel is a sampled-data representation of a suitable time-domain response, to achieve sufficient selectivity against harmonic components of the sinusoid being filtered. For example, for $k=1$ the time domain response corresponds to a rectangular time response, while for $k=2$, the time domain response corresponds to a triangular time response. In each case, phase angle differences (due to each of the sensors respective phase angle characteristic) among the analog signals respectively acquired with the plurality of sensors are propagated in the respective output signals from the decimation filter. The phase angle differences usually require correction or equalization before further signal processing is performed. In addition, the phase angle correction must be accomplished in a manner consistent with providing a substantially linear phase response over a bandpass range of interest. To reduce the effects of such phase angle differences, sensors are constructed in accordance with tight specifications which generally result in higher than desired sensor cost. Thus it is desirable to provide a decimation circuit capable of providing phase angle correction while operating in a manner consistent with providing a substantially linear phase response over the bandpass range of interest.

SUMMARY OF THE INVENTION

Generally speaking, the present invention fulfills the foregoing needs by providing a decimation circuit for filtering a stream of quantized electrical signals while providing phase angle correction with a substantially linear phase response over a predetermined passband range $F_B$. The stream of quantized electrical signals arrives at a predetermined rate $F_M$ from an oversampling delta-sigma modulator. The decimation circuit comprises a decimation filter for filtering the stream of quantized electrical signals to provide a filtered output signal at an output rate $F'_S$ defined by $F'_S = F_M/R$ wherein R is a positive integer. A phase corrector is coupled to the decimation filter to receive the filtered output signal and to correct the phase angle of the received filtered signal at least over the predetermined passband range $F_B$. The value for R is selected such that output rate $F'_S$ is sufficiently situated above bandpass range $F_B$ such that the phase corrector provides a desired substantially linear phase response over the passband range $F_B$.

A method of operating a decimation circuit for filtering includes the steps of decimation filtering so as to provide a filtered output signal at an output rate $F'_S$ defined by $F_S = F_M/R$ wherein R is a positive integer; selecting R such that output rate $F'_S$ is sufficiently situated above bandpass range $F_B$ to provide a desired substantially linear phase response over the passband range $F_B$; and correcting the phase angle of the filtered output signal at least over passband range $F_B$.

BRIEF DESCRIPTION OF THE DRAWINGS

The subject matter regarded as the invention is particularly pointed out and distinctly claimed in the concluding portion of the specification. The invention, however, both as to organization and method of operation, together with further objects and advantages thereof, may best be understood by reference to the following detailed description when read with the accompanying drawings in which:

FIGS. 2a, 2b, and 2d illustrate exemplary power spectra associated with operations of the analog-to-digital converter of FIG. 1, while

DETAILED DESCRIPTION OF THE INVENTION

Conventional analog-to-digital conversion frequently involves use of oversampled analog-to-digital (A/D) converters. One example of such A/D converter is delta-sigma converter 100 illustrated in FIG. 1. Systems in which analog-to-digital converters and delta-sigma converters may prove useful are described in U.S. Pat. No. 5,181,033 entitled "Digital Filter for Filtering and Decimating Delta Sigma Modulator Output Signals," by Yassa et al., issued Jan. 19, 1993, U.S. Pat. No. 5,126,961, entitled "Plural-Channel Decimator Filter, as for Delta-sigma Analog-to-Digital Converters," by Garverick, issued Jun. 30, 1992, U.S. Pat. No. 5,134,578, entitled "Digital Signal Processor for Selectively Performing Cordic, Division or Square-Rooting Procedures," by Garverick et al., issued Jul. 28, 1992, U.S. Pat. No. 4,951,052, entitled "Correction of Systematic Error in the Oversampled Analog-to-Digital Converters," by Jacob et al., issued Aug. 21, 1990, and U.S. Pat. No. 4,896,156, entitled "Switched-Capacitance Coupling Network for Differential-Input Amplifiers Not Requiring Balanced Input Signals," by Garycrick, issued Jan. 23, 1990, all of the foregoing patents assigned to the assignee of the present invention and herein incorporated by reference, and also described in "A Programmable Mixed Signal ASIC for Power Metering," by S.L. Garverick, K. Fujino, D.T. McGrath, and R.D. Baertsch, IEEE Journal of Solid State Circuits, Vol. 26, No. 12, Dec. 1991, pp. 2008–16, and "A Programmable Mixed Signal ASIC for Power Management," by D.T. McGrath, P. Jacobs, and H. Sailer, IEEE 1992 Custom Integrated Circuits Conference, pp. 19.4.1–19.4.2, both of which are herein incorporated by reference.

Figure 1:
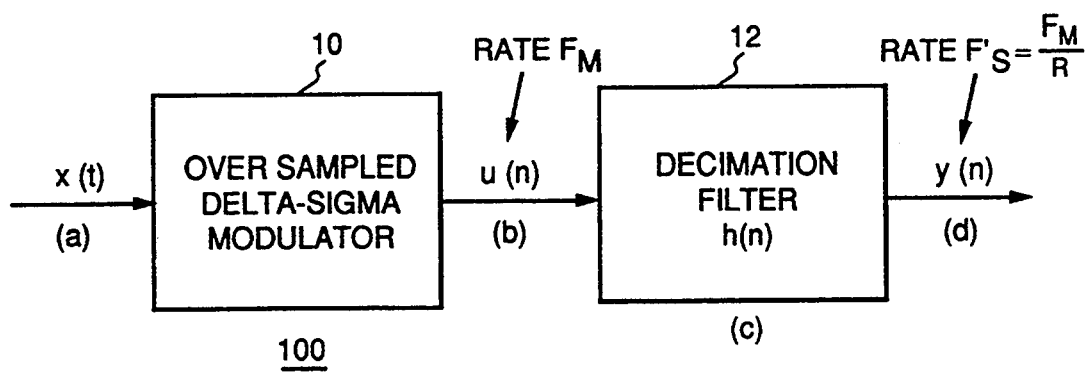
FIG. 1 is a block diagram showing a delta-sigma analog-to-digital converter which can conveniently incorporate a decimation circuit in accordance with the present invention.
Figure 2A:
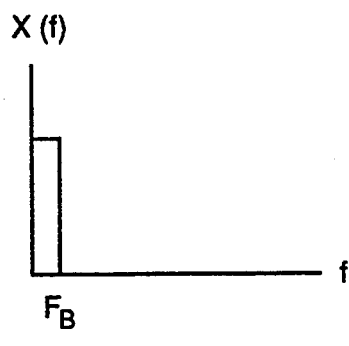
Figure 2B:
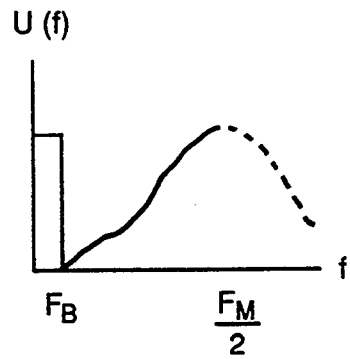
Figure 2C:
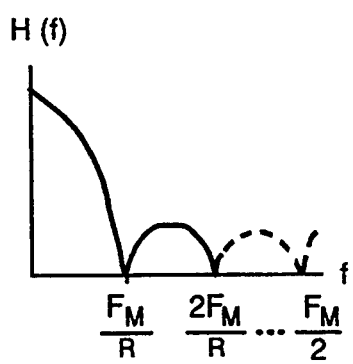
FIG. 2c shows a typical filter characteristics for the decimation filter of FIG. 1.
Figure 2D:
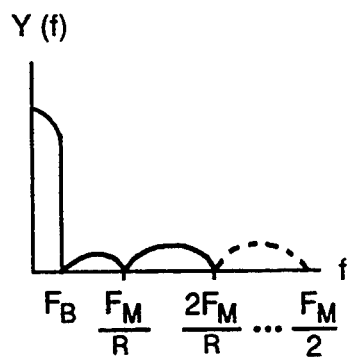

The technique of oversampling is frequently used in performing analog-to-digital conversion. As shown in FIG. 1, delta-sigma analog-to-digital (A/D) converter 100 comprises an oversampled interpolative delta-sigma modulator 10 which is coupled to a low pass decimation filter 12. The role of modulator 10 is to spectrally shape the quantization noise of a low resolution analog-to-digital converter so that the quantization noise is predominantly concentrated at high frequency. Input signal x(t) to modulator 10 may comprise a main sinusoid situated in a relatively low frequency region (e.g., at about 60 Hz) and harmonics present over a bandpass frequency range having an upper bound $F_B$ (e.g., at about 1500 Hz). Since the lower bound of such frequency range is near direct current (DC), such frequency range is conveniently referred hereinafter as bandpass frequency range $F_B$. The main sinusoid and harmonics which may be externally derived from a suitable sensor (not shown) such as a current or voltage sensor are sampled by modulator 10 at a relatively high sample rate $F_M$ (e.g., about 1.966 MHz). Subsequent low pass filtering and decimation can be used to remove the bulk of the quantization noise, resulting in a high resolution digital output signal at a reduced conversion rate $F_M/R$ where R is a positive integer generally referred as the decimation ratio, or ratio of the output clock rate $F'_S$ to the input clock or sample rate $F_M$. For a decimation ratio of 512, $F'_S$ is about 3.8 KHz which is sufficient to meet the Nyquist rate sampling requirements over bandpass frequency range $F_B$, that is, $F'_S$ is at least twice the highest spectral component expected over frequency range $F_B$.

In FIG. 1, the following functions are represented: input signal x(t), modulator output signal u(n) and filter output signal y(n) which constitutes the A/D converter output signal, along with the filter impulse response characteristics h(n). The corresponding frequency spectra X(f), U(f) and Y(f), and filter characteristics H(f), respectively are shown in FIGS. 2a, 2b, 2d and 2c and represent the conditions in the circuit of FIG. 1 at locations (a), (b), (d) and (c) respectively. The input signal typically arrives with a phase angle error which may vary depending on the particular sensor from which the input signal is acquired. If the phase angle error is left uncorrected, this can detrimentally affect the accuracy of signal measurements over the bandpass range.

Figure 3:
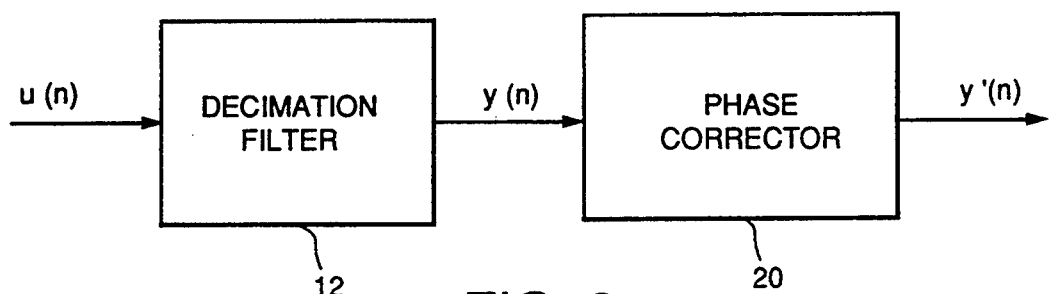
FIG. 3 is a block diagram of a decimation circuit with a phase corrector, in accordance with the present invention.

FIG. 3 shows that in accordance with an embodiment of the present invention, a phase corrector 20 is coupled to receive the output signal y(n) of decimation filter 12 so as to provide a desired phase angle correction to output signal y'(n). As suggested above, the phase angle correction can be chosen to equalize the respective phase angle for each signal acquired from a respective sensor, i.e., each signal from a different sensor has a substantially equal phase angle so as to avoid inaccuracy of signal measurement over the bandpass range. An important requirement, for phase corrector 20 is to provide a substantially linear phase response over the bandpass region $F_B$. Further, phase corrector 20, to reduce size and power requirements, should preferably be implemented with a minimum number of components. For example, a phase corrector not fulfilling the foregoing requirements, would be difficult to incorporate in a single monolithic electronic integrated circuit chip for a delta-sigma converter.

Figure 4:
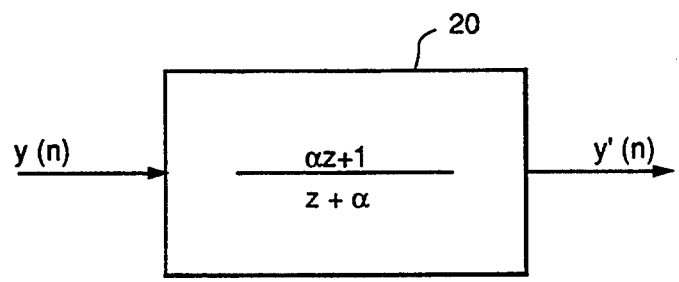
FIG. 4 illustrates the z domain transfer function for the phase corrector of FIG. 3.

FIG. 4 illustrates that phase corrector 20 can be conveniently selected as an infinite impulse response (IIR) digital filter having a z domain frequency response defined by $H(z) = \alpha z + 1/z + \alpha$ wherein $\alpha$ is number such that $|\alpha| < 1$ for stability purposes. Further, as will be explained shortly hereafter, when such phase corrector is used in an oversampled environment, substantial phase angle correction is provided while maintaining a substantially linear phase response at least over the bandpass frequency range of interest. For a detailed discussion of IIR digital filters, see, for example, A.V. Oppenheim and R.W. Schafer, "Digital Signal Processing", 1975, available from Prentice-Hall Inc., pp. 18 and 197–237, herein incorporated by reference.

Figure 5:
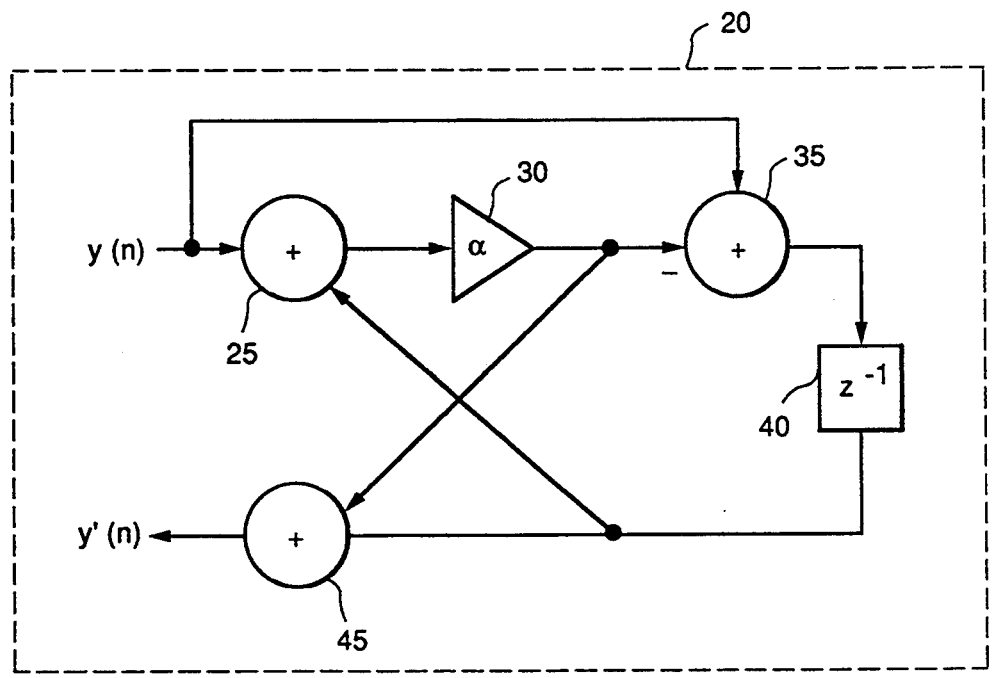
FIG. 5 is block diagram showing an implementation for the phase corrector of FIG. 4.

FIG. 5 shows that phase corrector 20 can be advantageously constructed with relatively few components and thus another advantage of the present invention is its simplicity of implementation. It will be appreciated by those skilled in the art that the exemplary embodiment of FIG. 5 is a single-multiplier Gray-Markel lattice which is an all-pass digital filter. See, for example, "Handbook of Digital Signal Processing Engineering Applications", edited by D.F. Elliot, 1987, available from Academic Press, p. 456, herein incorporated by reference. A first digital summer 25 having first and second inputs receives the filtered output signal y(n) from the decimation filter at the first input and receives a feedback signal at the second input so as to produce a respective combined output signal. A digital multiplier 30 is coupled to first digital summer 25 to receive the combined output signal produced by summer 25. Multiplier 30 multiplies the received combined output signal by a multiplying factor which substantially corresponds to the $\alpha$ number. A digital subtractor 35 receives the filtered signal from the decimation filter as a minuend input signal and receives the output signal from multiplier 30 as a subtrahend input signal so as to produce a difference output signal. A delay unit 40 receives the difference signal to produce a delayed difference output signal. The delayed difference output signal constitutes the feedback signal applied to first summer 25. A second digital summer 45 having first and second inputs receives at the first input the delayed difference signal and receives at the second input the output signal from multiplier 30. Second summer 45 produces a respective combined output signal which constitutes the output of the phase corrector. Preferably, digital multiplier 30 is a multibit floating point multiplier, digital subtractor 35 is a multibit floating point subtractor, and each of first and second summers 25 and 45 is a respective multibit floating point summer. The value for the number $\alpha$ is suitably selected depending on the particular implementation for a given decimation filter/phase corrector implementation.

Figure 6A:
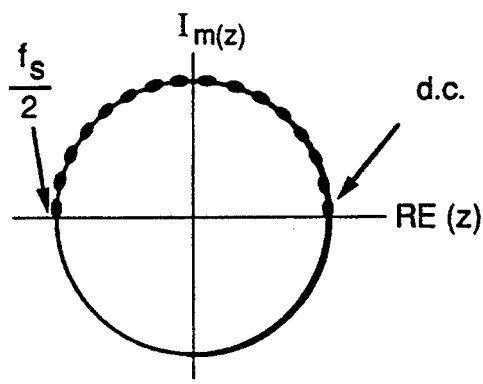
FIGS. 6a, 6b, and 6c illustrate exemplary z domain representations associated with operations of a phase corrector having the z domain transfer function in accordance with the present invention.
Figure 6B:
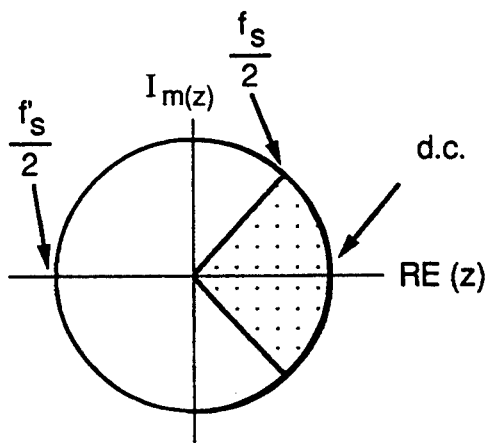
Figure 6C:
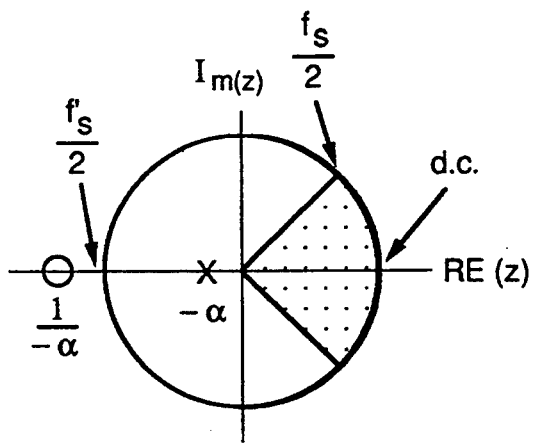

FIGS. 6a–6c illustrate exemplary z plane representations which allows for conceptualizing the advantageous results obtained in an oversampled environment in accordance with the present invention. FIG. 6a illustrates a non-oversampled environment wherein quantization data is acquired at a sample rate $F_S$ so that the useful bandwidth is represented by the arc between the DC point and the half bandwidth point $F_S/2$. In an oversampled environment, the useful bandwidth is represented by the arc between the DC point and the point corresponding to the haft bandwidth $F'_S/2$. In the example, illustrated in FIG. 6b an oversampling factor of four is depicted. As those skilled in the art will appreciate, magnitude corrector 20 introduces a pole located at $-\alpha$ and a zero located at the reciprocal value for $-\alpha$. It can be shown that the respective effects of the pole and zero, for the oversampled case are significantly less as compared to the non-oversampled case illustrated in FIG. 6a. Since such oversampling is directly related to decimation ratio R, a key advantage of the present invention is provided by selecting the decimation ratio such that output rate $F'_S$ is sufficiently situated above bandpass range $F_B$ to provide a substantially linear response over the predetermined passband range $F_B$. Thus, when operated in such oversampled environment, the phase corrector having the z domain response as described in the context of FIG. 3, conveniently and economically provides a desired phase angle correction while providing a substantially linear phase response over the bandpass frequency range $F_B$. It will be appreciated by those skilled in the art that in order to return to the baseband frequency range of interest, in such oversampled environment, additional suitable decimation circuitry (not shown) is conveniently employed subsequent to phase corrector 20 (FIG. 3). For instance, in the foregoing example, such additional decimation circuitry would provide a corresponding decimation factor of four in order to return to the bandpass frequency range of interest.

Figure 7A:
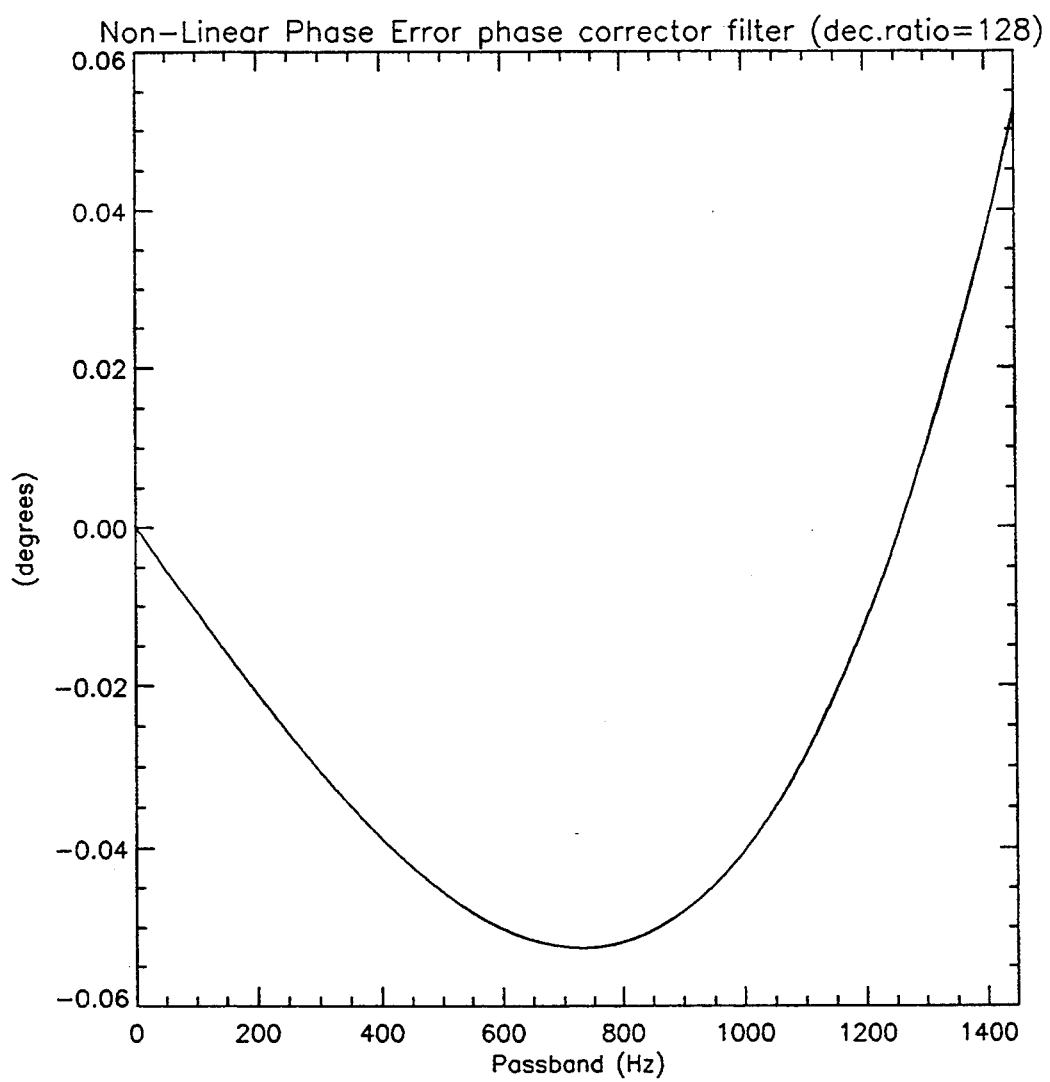
FIG. 7a illustrates nonlinear phase error in an oversampled environment.
Figure 7B:
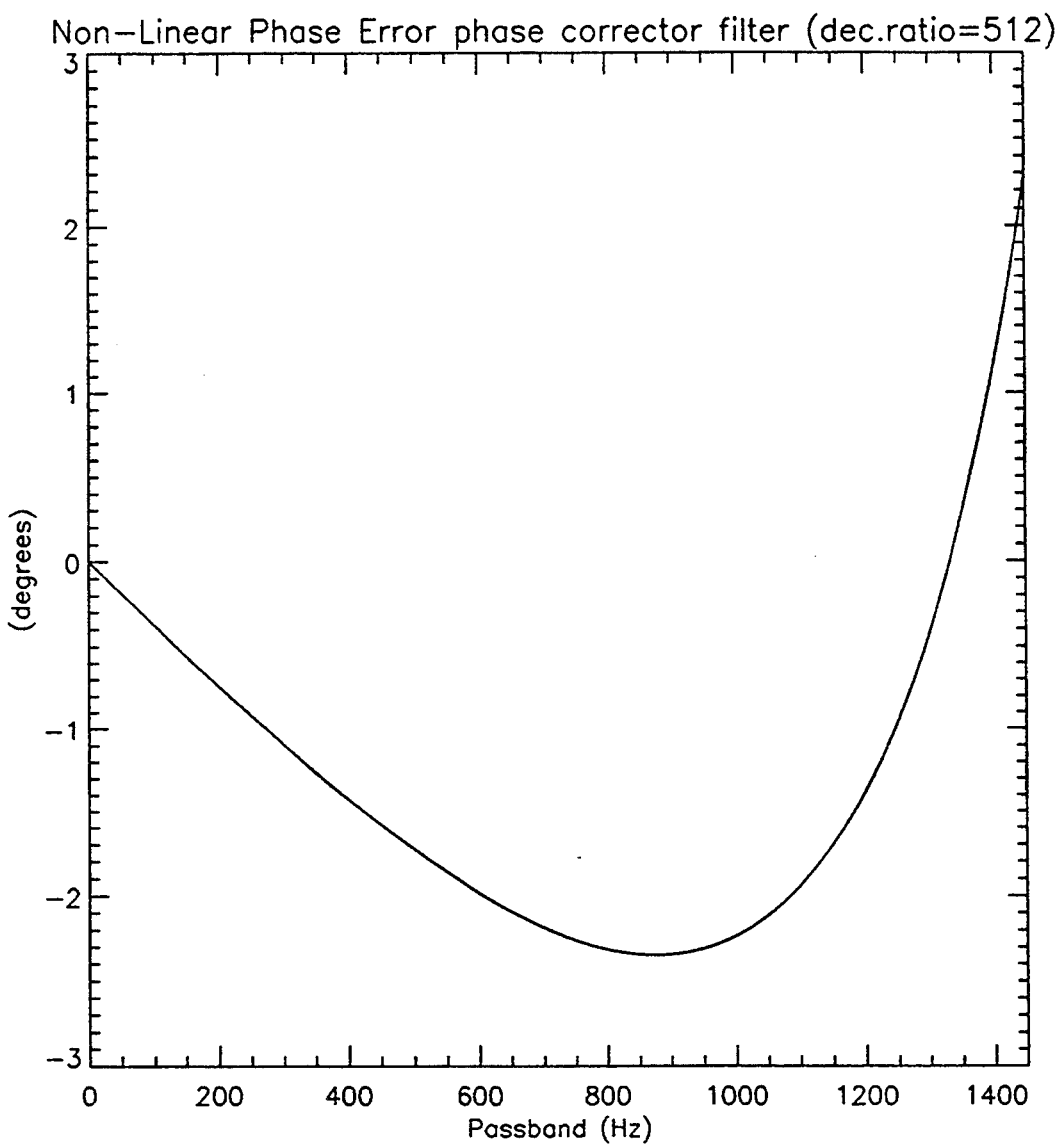
FIG. 7b, illustrates nonlinear phase error in a nonoversampled environment in accordance with the present invention.

FIGS. 7a–7b show that the decimation circuit in accordance with the present invention when operated in an oversampled environment is capable of providing substantially linear phase response over the bandpass frequency $F_B$. For example, comparison of FIGS. 7a and 7b shows that the nonlinearity phase error is improved by at least a factor of 40 when decimation circuit 20 is used in the oversampled enviromnent.

A method of operating a decimation circuit in accordance with the present invention may include the steps of decimation filtering the stream of quantized electrical signals from an oversampled analog-to-digital converter to provide a filtered output signal at an output rate $F_S$ (defined by $F'_S=F/R$ wherein R is a positive integer generally referred to as decimation ratio) using a suitable decimation filter which, by way of example and not of limitation, can be a sinc$^k$ type of decimation filter; selecting the decimation ratio R such that output rate $F'_S$ is sufficiently situated above bandpass range $F_B$ so as to provide a substantially linear phase over the passband range $F_B$; and correcting the phase angle of the filtered output signal at least over the passband range $F_B$.

While only certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A circuit for filtering a stream of quantized electrical signals from an analog-to-digital converter while providing a phase angle correction and a substantially linear phase response over a predetermined passband range $F_B$, said stream of quantized electrical signals having a predetermined rate $F_M$, said circuit comprising:

a decimation filter for filtering said stream of quantized electrical signals and adapted to provide a filtered output signal at an output rate $F'_S$ defined by $F'_S=F_M/R$ wherein R is a positive integer; and a phase corrector coupled to said decimation filter to to receive said filtered output signal to predeterminedly correct the phase angle of said filtered output signal at least over said predetermined passband range $F_B$, said phase corrector comprising an infinite impulse response (IIR) digital filter having a z domain response defined by:

$$H(z) = \frac{\alpha z + 1}{z + \alpha}$$

wherein $\alpha$ is a number such that $|\alpha|<1$.

2. The circuit of claim 1 wherein said IIR digital filter comprises:

a first digital summer having first and second inputs, said first digital summer for receiving at the first input thereof the filtered output signal from said decimation filter and for receiving at the second input thereof a feedback signal, said first digital summer adapted to produce a respective combined output signal;

a digital multiplier coupled to said first digital multiplier to receive the combined output signal produced therein and adapted to multiply said received combined output signal by a multiplying factor substantially corresponding to said $\alpha$ number;

a digital subtractor for receiving the filtered signal from said decimation filter as a minuend input signal and for receiving the output signal from said multiplier as a subtrahend input signal, said digital subtractor adapted to produce a difference output signal;

a delay unit coupled to said digital subtractor to receive the difference output signal produced therein and adapted to produce a delayed difference signal constituting the feedback signal received by said first digital summer; and a second digital summer having first and second inputs, said second digital summer for receiving at the first input thereof the delayed difference signal and for receiving at the second input thereof the output signal from said multiplier, said second digital summer adapted to produce a combined output signal constituting the output signal of said IIR filter.

3. The circuit of claim 2 wherein said digital multiplier comprises a multibit floating point multiplier.

4. The circuit of claim 2 wherein said digital subtractor comprises a multibit floating point subtractor.

5. The circuit of claim 2 wherein said first and second summers comprise respective multibit floating point summers.

6. The circuit of claim 1 wherein R is selected such that output rate $F'_S$ is sufficiently situated above passband range $F_B$ such that said phase corrector provides a desired substantially linear phase response over said predetermined passband range $F_B$.

7. The circuit of claim 1 wherein said analog-to-digital converter is an oversampled sigma-delta modulator.

8. A circuit for filtering a stream of quantized electrical signals while providing a phase-angle correction and a substantially linear phase response over a predetermined passband range $F_B$, said stream of quantized electrical signals having a predetermined rate FM, said circuit comprising:

a single monolithic electronic integrated circuit chip incorporating a delta-sigma modulator for providing said stream of quantized electrical signals;

said chip further including:

a decimation filter for filtering said stream of quantized electrical signals and adapted to provide a filtered output signal at an output rate $F'_S$ defined by $F'_S = F_M/R$ wherein R is a positive integer; and a phase corrector coupled to said decimation filter to receive said filtered output signal to predeterminedly correct the phase angle of said filtered output signal at least over said predetermined passband range $F_B$, said phase corrector comprising an infinite impulse response (IIR) digital filter having a Z domain response defined by:

$$H(z) = \frac{\alpha z + 1}{z + \alpha}$$

wherein $\alpha$ is a number such that $|\alpha| < 1$;

R being selected such that output rate $F'_S$ is sufficiently situated above passband range $F_B$ such that said phase corrector provides a desired substantially linear phase response over said predetermined passband range $F_B$.

9. The circuit of claim 8 wherein said IIR digital filter comprises:

a first digital summer having first and second inputs, said first digital summer for receiving at the first input thereof the filtered output signal from said decimation filter and for receiving at the second input thereof a feedback signal, said first digital summer adapted to produce a respective combined output signal;

a digital multiplier coupled to said first digital multiplier to receive the combined output signal produced therein and adapted to multiply said received combined output signal by a multiplying factor substantially corresponding to said a number;

a digital subtractor for receiving the filtered signal from said decimation filter as a minuend input signal and for receiving the output signal from said multiplier as a subtrahend input signal, said digital subtractor adapted to produce a difference output signal;

a delay unit coupled to said digital subtractor to receive the difference output signal produced therein and adapted to produce a delayed difference signal constituting the feedback signal received by said first digital summer; and a second digital summer having first and second inputs, said second digital summer for receiving at the first input thereof the delayed difference signal and for receiving at the second input thereof the output signal from said multiplier, said second digital summer adapted to produce a combined output signal constituting the output signal of said IIR filter.

10. The circuit of claim 9 wherein said digital multiplier comprises a multibit floating point multiplier.

11. The circuit of claim 9 wherein said digital subtractor comprises a multibit floating point subtractor.

12. The circuit of claim 9 wherein said first and second summers comprise respective multibit floating point summers.

13. A method for filtering a stream of quantized electrical signals while providing a phase angle correction and a substantially linear response over a predetermined passband range $F_B$, said stream of quantized electrical signals having a predetermined rate $F_M$, said method comprising:

decimation filtering said stream of quantized electrical signals to provide a filtered output signal having an output rate $F'_S$ defined by $F'_S = F_M/R$ wherein R is a positive integer;

selecting R such that output rate $F'_S$ is sufficiently situated above passband range $F_B$ to provide a desired substantially linear phase response over said predetermined passband range $F_B$; and correcting a phase angle of said filtered output signal at least over said predetermined passband range $F_B$.

* * * * *